(12) United States Patent
Raaf et al.

(10) Patent No.: US 7,187,699 B1
(45) Date of Patent: Mar. 6, 2007

(54) METHOD AND APPARATUS FOR DATA RATE MATCHING

(75) Inventors: Bernhard Raaf, Munich (DE); Volker Sommer, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/937,027

(22) PCT Filed: Mar. 20, 2000

(86) PCT No.: PCT/EP00/02440

§ 371 (c)(1),
(2), (4) Date: Sep. 19, 2001

(87) PCT Pub. No.: WO00/57562

PCT Pub. Date: Sep. 28, 2000

(30) Foreign Application Priority Data

Mar. 19, 1999 (EP) .................................. 99105680

(51) Int. Cl.
*H04J 3/22* (2006.01)
(52) U.S. Cl. ....................................... 370/545; 714/790
(58) Field of Classification Search ................ 714/790, 714/791, 701, 786, 755, 787–788, 781; 375/130, 375/147, 267, 377, 295; 370/545
See application file for complete search history.

(56) References Cited

U.S. PATENT DOCUMENTS

| 6,289,486 B1 * | 9/2001 | Lee et al. .................... 714/788 |
| 6,370,669 B1 * | 4/2002 | Eroz et al. ................... 714/774 |
| 6,427,214 B1 * | 7/2002 | Li et al. ...................... 714/701 |
| 6,430,722 B1 * | 8/2002 | Eroz et al. ................... 714/755 |
| 6,543,013 B1 * | 4/2003 | Li et al. ...................... 714/701 |
| 6,622,281 B1 * | 9/2003 | Yun et al. .................... 714/790 |

FOREIGN PATENT DOCUMENTS

| GB | 2 296 165 | 6/1996 |
| WO | WO 00/03486 | 1/2000 |

OTHER PUBLICATIONS

3GPP TS 25.212, "UMTS:Multiplexing and Channel Coding", Version 3.5.0, ETSI, 1999.*
Modified Rate Matching Algorithm in uplink—pp. 1-4.

* cited by examiner

*Primary Examiner*—Hassan Kizou
*Assistant Examiner*—Habte Mered
(74) *Attorney, Agent, or Firm*—Bell, Boyd & Lloyd LLC

(57) ABSTRACT

A method and apparatus for data rate matching, wherein elements to be transmitted are distributed over a number of radio frames via an interleaver and are punctured or repeated, with the puncturing or repetition being carried out in such a manner that, when it is related to the original arrangement of the element before interleaving, the pattern avoids puncturing or repetition of adjacent elements, or of elements which are not far apart from one another.

8 Claims, 12 Drawing Sheets

FIG 3

Row by row processing
8[4[2×2]x2]

Bit sequence: 0 1 2 3 4 5 6 7 8 9 10 11 12 13 14 15 16 17 18 ...159

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 |
| 64 | 65 | 66 | 67 | 68 | 69 | 70 | 71 |
| 72 | 73 | 74 | 75 | 76 | 77 | 78 | 79 |
| 80 | 81 | 82 | 83 | 84 | 85 | 86 | 87 |
| 88 | 89 | 90 | 91 | 92 | 93 | 94 | 95 |
| 96 | 97 | 98 | 99 | 100 | 101 | 102 | 103 |
| 104 | 105 | 106 | 107 | 108 | 109 | 110 | 111 |
| 112 | 113 | 114 | 115 | 116 | 117 | 118 | 119 |
| 120 | 121 | 122 | 123 | 124 | 125 | 126 | 127 |
| 128 | 129 | 130 | 131 | 132 | 133 | 134 | 135 |
| 136 | 137 | 138 | 139 | 140 | 141 | 142 | 143 |
| 144 | 145 | 146 | 147 | 148 | 149 | 150 | 151 |
| 152 | 153 | 154 | 155 | 156 | 157 | 158 | 159 |

| 0 | 4 | 2 | 6 | 1 | 5 | 3 | 7 |
|---|---|---|---|---|---|---|---|
| 8 | 12 | 10 | 14 | 9 | 13 | 11 | 15 |
| 16 | 20 | 18 | 22 | 17 | 21 | 19 | 23 |
| 24 | 28 | 26 | 30 | 25 | 29 | 27 | 31 |
| 32 | 36 | 34 | 38 | 33 | 37 | 35 | 39 |
| 40 | 44 | 42 | 46 | 41 | 45 | 43 | 47 |
| 48 | 52 | 50 | 54 | 49 | 53 | 51 | 55 |
| 56 | 60 | 58 | 62 | 57 | 61 | 59 | 63 |
| 64 | 68 | 66 | 70 | 65 | 69 | 67 | 71 |
| 72 | 76 | 74 | 78 | 73 | 77 | 75 | 79 |
| 80 | 84 | 82 | 86 | 81 | 85 | 83 | 87 |
| 88 | 92 | 90 | 94 | 89 | 93 | 91 | 55 |
| 96 | 100 | 98 | 102 | 97 | 101 | 99 | 103 |
| 104 | 108 | 106 | 110 | 105 | 109 | 107 | 111 |
| 112 | 116 | 114 | 118 | 113 | 117 | 115 | 119 |
| 120 | 124 | 122 | 126 | 121 | 125 | 123 | 127 |
| 128 | 132 | 130 | 134 | 129 | 133 | 131 | 135 |
| 136 | 140 | 138 | 142 | 137 | 141 | 139 | 143 |
| 144 | 148 | 146 | 150 | 145 | 149 | 147 | 151 |
| 152 | 156 | 154 | 158 | 153 | 157 | 155 | 159 |

Radio frame #1
Radio frame #2
...
Radio frame #8

FIG 4

Row by row processing
8[4[2x2]x2]

Bit sequence: 0 1 2 3 4 5 6 7 8 9 10 11 12 13 14 15 16 17 18 ...159

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 |
| 64 | 65 | 66 | 67 | 68 | 69 | 70 | 71 |
| 72 | 73 | 74 | 75 | 76 | 77 | 78 | 79 |
| 80 | 81 | 82 | 83 | 84 | 85 | 86 | 87 |
| 88 | 89 | 90 | 91 | 92 | 93 | 94 | 95 |
| 96 | 97 | 98 | 99 | 100 | 101 | 102 | 103 |
| 104 | 105 | 106 | 107 | 108 | 109 | 110 | 111 |
| 112 | 113 | 114 | 115 | 116 | 117 | 118 | 119 |
| 120 | 121 | 122 | 123 | 124 | 125 | 126 | 127 |
| 128 | 129 | 130 | 131 | 132 | 133 | 134 | 135 |
| 136 | 137 | 138 | 139 | 140 | 141 | 142 | 143 |
| 144 | 145 | 146 | 147 | 148 | 149 | 150 | 151 |
| 152 | 153 | 154 | 155 | 156 | 157 | 158 | 159 |

| 0 | 4 | 2 | 6 | 1 | 5 | 3 | 7 |
|---|---|---|---|---|---|---|---|
| 8 | 12 | 10 | 14 | 9 | 13 | 11 | 15 |
| 16 | 20 | 18 | 22 | 17 | 21 | 19 | 23 |
| 24 | 28 | 26 | 30 | 25 | 29 | 27 | 31 |
| 32 | 36 | 34 | 38 | 33 | 37 | 35 | 39 |
| 40 | 44 | 42 | 46 | 41 | 45 | 43 | 47 |
| 48 | 52 | 50 | 54 | 49 | 53 | 51 | 55 |
| 56 | 60 | 58 | 62 | 57 | 61 | 59 | 63 |
| 64 | 68 | 66 | 70 | 65 | 69 | 67 | 71 |
| 72 | 76 | 74 | 78 | 73 | 77 | 75 | 79 |
| 80 | 84 | 82 | 86 | 81 | 85 | 83 | 87 |
| 88 | 92 | 90 | 94 | 89 | 93 | 91 | 55 |
| 96 | 100 | 98 | 102 | 97 | 101 | 99 | 103 |
| 104 | 108 | 106 | 110 | 105 | 109 | 107 | 111 |
| 112 | 116 | 114 | 118 | 113 | 117 | 115 | 119 |
| 120 | 124 | 122 | 126 | 121 | 125 | 123 | 127 |
| 128 | 132 | 130 | 134 | 129 | 133 | 131 | 135 |
| 136 | 140 | 138 | 142 | 137 | 141 | 139 | 143 |
| 144 | 148 | 146 | 150 | 145 | 149 | 147 | 151 |
| 152 | 156 | 154 | 158 | 153 | 157 | 155 | 159 |

Radio frame #1
Radio frame #2
Radio frame #8

FIG 6

Input bit sequence: 0 1 2 3 4 5 6 7 8 9 10 11 12 13 14 15 16 17 18 ...159

1st stage block Interleaving

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 |
| 64 | 65 | 66 | 67 | 68 | 69 | 70 | 71 |
| 72 | 73 | 74 | 75 | 76 | 77 | 78 | 79 |
| 80 | 81 | 82 | 83 | 84 | 85 | 86 | 87 |
| 88 | 89 | 90 | 91 | 92 | 93 | 94 | 95 |
| 96 | 97 | 98 | 99 | 100 | 101 | 102 | 103 |
| 104 | 105 | 106 | 107 | 108 | 109 | 110 | 111 |
| 112 | 113 | 114 | 115 | 116 | 117 | 118 | 119 |
| 120 | 121 | 122 | 123 | 124 | 125 | 126 | 127 |
| 128 | 129 | 130 | 131 | 132 | 133 | 134 | 135 |
| 136 | 137 | 138 | 139 | 140 | 141 | 142 | 143 |
| 144 | 145 | 146 | 147 | 148 | 149 | 150 | 151 |
| 152 | 153 | 154 | 155 | 156 | 157 | 158 | 159 |

Puncturing with simple shifting rule

Column randomizing

| 0 | 4 | 2 | 6 | 1 | 5 | 3 | 7 |
|---|---|---|---|---|---|---|---|
| 8 | 12 | 10 | 14 | 9 | 13 | 11 | 15 |
| 16 | 20 | 18 | 22 | 17 | 21 | 19 | 23 |
| 24 | 28 | 26 | 30 | 25 | 29 | 27 | 31 |
| 32 | 36 | 34 | 38 | 33 | 37 | 35 | 39 |
| 40 | 44 | 42 | 46 | 41 | 45 | 43 | 47 |
| 48 | 52 | 50 | 54 | 49 | 53 | 51 | 55 |
| 56 | 60 | 58 | 62 | 57 | 61 | 59 | 63 |
| 64 | 68 | 66 | 70 | 65 | 69 | 67 | 71 |
| 72 | 76 | 74 | 78 | 73 | 77 | 75 | 79 |
| 80 | 84 | 82 | 86 | 81 | 85 | 83 | 87 |
| 88 | 92 | 90 | 94 | 89 | 93 | 91 | 55 |
| 96 | 100 | 98 | 102 | 97 | 101 | 99 | 103 |
| 104 | 108 | 106 | 110 | 105 | 109 | 107 | 111 |
| 112 | 116 | 114 | 118 | 113 | 117 | 115 | 119 |
| 120 | 124 | 122 | 126 | 121 | 125 | 123 | 127 |
| 128 | 132 | 130 | 134 | 129 | 133 | 131 | 135 |
| 136 | 140 | 138 | 142 | 137 | 141 | 139 | 143 |
| 144 | 148 | 146 | 150 | 145 | 149 | 147 | 151 |
| 152 | 156 | 154 | 158 | 153 | 157 | 155 | 159 |

Frame #1 — Frame #2 ... Frame #8

FIG 9

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 |
| 64 | 65 | 66 | 67 | 68 | 69 | 70 | 71 |
| 72 | 73 | 74 | 75 | 76 | 77 | 78 | 79 |
| 80 | 81 | 82 | 83 | 84 | 85 | 86 | 87 |
| 88 | 89 | 90 | 91 | 92 | 93 | 94 | 95 |
| 96 | 97 | 98 | 99 | 100 | 101 | 102 | 103 |
| 104 | 105 | 106 | 107 | 108 | 109 | 110 | 111 |
| 112 | 113 | 114 | 115 | 116 | 117 | 118 | 119 |
| 120 | 121 | 122 | 123 | 124 | 125 | 126 | 127 |

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 |
| 64 | 65 | 66 | 67 | 68 | 69 | 70 | 71 |
| 72 | 73 | 74 | 75 | 76 | 77 | 78 | 79 |
| 80 | 81 | 82 | 83 | 84 | 85 | 86 | 87 |

FIG 11

| S;T | | | | | | | | | | | | | | | | | | | | |
|---|---|---|---|---|---|---|---|---|---|---|---|---|---|---|---|---|---|---|---|---|
| K | 1 | 2 | | 4 | | | | 8 | | | | | | | | | | | | |
| k | 0 | 0 | 1 | 0 | 1 | 2 | 3 | 0 | 1 | 2 | 3 | 4 | 5 | 6 | 7 | | | | | |
| Q 1 | 0;0 | 0;0 | 0;1 | 0;0 | 0;2 | 0;1 | 0;3 | 0;0 | 0;4 | 0;2 | 0;6 | 0;1 | 0;5 | 0;3 | 0;7 | | | | | |
| Q 2 | | 0;0 | 1;1 | 0;0 | 0;1 | 1;3 | 0;2 | 0;0 | 0;2 | 0;1 | 0;3 | 1;5 | 1;7 | 1;6 | 0;4 | | | | | |
| Q 3 | | | | 0;0 | 1;2 | 2;3 | 0;1 | 0;0 | 1;4 | 2;6 | 0;2 | 1;3 | 2;7 | 0;1 | 1;5 | | | | | |
| Q 4 | | | | 0;0 | 1;2 | 2;3 | 0;1 | 0;0 | 0;1 | 2;5 | 1;4 | 3;7 | 2;6 | 1;3 | 0;2 | | | | | |
| Q 5 | | | | | | | | 0;0 | 3;4 | 2;2 | 4;6 | 4;5 | 1;1 | 5;7 | 2;3 | | | | | |
| Q 6 | | | | | | | | 0;0 | 1;2 | 2;3 | 0;1 | 5;7 | 3;5 | 4;6 | 2;4 | | | | | |
| Q 7 | | | | | | | | 0;0 | 3;4 | 5;6 | 1;2 | 6;7 | 2;3 | 4;5 | 0;1 | | | | | |
| Q 8 | | | | | | | | 0;0 | 3;4 | 5;6 | 1;2 | 6;7 | 2;3 | 4;5 | 0;1 | | | | | |

FIG 12

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 |
| 64 | 65 | 66 | 67 | 68 | 69 | 70 | 71 |
| 72 | 73 | 74 | 75 | 76 | 77 | 78 | 79 |
| 80 | 81 | 82 | 83 | 84 | 85 | 86 | 87 |
| 88 | 89 | 90 | 91 | 92 | 93 | 94 | 95 |
| 96 | 97 | 98 | 99 | 100 | 101 | 102 | 103 |
| 104 | 105 | 106 | 107 | 108 | 109 | 110 | 111 |
| 112 | 113 | 114 | 115 | 116 | 117 | 118 | 119 |
| 120 | 121 | 122 | 123 | 124 | 125 | 126 | 127 |
| 128 | 129 | 130 | 131 | 132 | 133 | 134 | 135 |
| 136 | 137 | 138 | 139 | 140 | 141 | 142 | 143 |
| 144 | 145 | 146 | 147 | 148 | 149 | 150 | 151 |
| 152 | 153 | 154 | 155 | 156 | 157 | 158 | 159 |

FIG 13

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 |
| 64 | 65 | 66 | 67 | 68 | 69 | 70 | 71 |
| 72 | 73 | 74 | 75 | 76 | 77 | 78 | 79 |
| 80 | 81 | 82 | 83 | 84 | 85 | 86 | 87 |
| 88 | 89 | 90 | 91 | 92 | 93 | 94 | 95 |
| 96 | 97 | 98 | 99 | 100 | 101 | 102 | 103 |
| 104 | 105 | 106 | 107 | 108 | 109 | 110 | 111 |
| 112 | 113 | 114 | 115 | 116 | 117 | 118 | 119 |
| 120 | 121 | 122 | 123 | 124 | 125 | 126 | 127 |

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 |
| 64 | 65 | 66 | 67 | 68 | 69 | 70 | 71 |
| 72 | 73 | 74 | 75 | 76 | 77 | 78 | 79 |
| 80 | 81 | 82 | 83 | 84 | 85 | 86 | 87 |
| 88 | 89 | 90 | 91 | 92 | 93 | 94 | 95 |
| 96 | 97 | 98 | 99 | 100 | 101 | 102 | 103 |
| 104 | 105 | 106 | 107 | 108 | 109 | 110 | 111 |
| 112 | 113 | 114 | 115 | 116 | 117 | 118 | 119 |
| 120 | 121 | 122 | 123 | 124 | 125 | | |

METHOD AND APPARATUS FOR DATA RATE MATCHING

BACKGROUND OF THE INVENTION

The present invention relates to a method and an apparatus for data transmission with interleaving and subsequent rate matching owing to puncturing or repetition.

Digital communications systems are designed for transmitting data by representing the data in a form which makes it easier to transmit the data via a communication medium. For example, in the case of radio transmissions, the data is transmitted between transmitters and receivers in the communications system in the form of radio signals. In the case of broadband telecommunications networks, the data can be in the form of light, and can be transmitted, for example, via a fiber-optical network between transmitters and receivers in the system.

During data transmission, bits or symbols in the transmitted data may be corrupted, wherein these bits or symbols cannot be determined correctly in the receiver. For this reason, the data communications systems frequently contain ways for ameliorating the corruption of the data which occurs during transmission. One of these ways is to equip transmitters in the system with coders, which use an error control code to code the data before transmission. The error control code is designed such that it adds redundancy to the data in a controlled manner. In the receiver, errors which occur during transmission can be corrected by decoding the error control code, as a result of which the original data is reproduced. The decoding is carried out using an error decoding algorithm, which corresponds to the error control code, which is known to the receiver.

Once the data has been decoded, it is often necessary, for data rate matching, to puncture or to repeat data bits or symbols from a block of coded data, before such data is transmitted. In this context, the term puncturing refers to a process of removing or deleting bits from a coded data block, with the effect that the punctured bit is not transmitted with this data block. Puncturing could be required, for example, because a multiple access method which is used for transmitting the data via the data-carrying media requires formatting of the data to form blocks of predetermined size, which size does not correspond to the size of the coded data frame.

In order to accommodate the coded data frame in a transport data block having a predetermined size, data bits are therefore either punctured from the coded data frame in order to reduce the size of the coded data block in a situation in which the coded data frame is larger than the size of the transport data block, or bits in the coded data frame are repeated in a situation in which the coded data frame is smaller than the predetermined size of the transport data block. This will be explained in more detail in the following text using a mobile radio communications system by way of example.

Mobile radio communications systems are equipped with multiple access systems which operate, for example, on the basis of time division multiple access (TDMA) as is used, for example, in the global mobile radio system (GSM), a mobile radio communications standard which is standardized by the European Telecommunications Standard Institution. As an alternative, the mobile radio communications system could be equipped with a multiple access system operating using code division multiple access (CDMA), such as the UMTS system proposed for the third-generation universal mobile telecommunications system.

However, as can be seen, any desired data communications system could be used to represent an exemplary embodiment of the present invention, such as a local data network or a broadband telecommunications network operating using the asynchronous transmission mode. These examples of data communications systems are characterized, in particular, in that data is transmitted as frames, packets or blocks. In the case of a mobile radio communications system, the data is transmitted within radio signals which carry data and represent a predetermined amount of data. FIG. 7 shows one example of such a mobile radio communications system.

FIG. 7 shows three base stations BS which exchange radio signals with mobile stations MS in a radio coverage area which is formed by cells 1, which are defined by dashed lines 2. The base stations BS are coupled to a network relay system NET. The mobile stations MS and the base stations BS exchange data by using radio signals, in that they transmit radio signals 4 between antennas 6, which are coupled to the mobile stations MS and to the base stations BS. The data is transmitted between the mobile stations MS and the base stations BS using a data communications apparatus, in which the data is transformed into radio signals 4, which are transmitted to the receiving antenna 6, which identifies the radio signals. The data is reproduced from the radio signals by the receiver. The present invention can, in this case, be used both in the uplink direction (MS BS) and in the downlink direction (BS MS).

FIG. 8 shows an example of a data communications apparatus which forms a radio communication path between one of the mobile stations MS and one of the base stations BS, with parts which also appear in FIG. 7 having identical numerical designations. In FIG. 8, a data source 10 produces data frames 8 at a rate which is governed by the type of data produced by the source. The data frames 8 produced by the source 10 are supplied to a rate converter 12 which converts the data frames 8 to form transport data blocks 14. The transport data blocks 14 are designed such that they are of essentially the same size, with a predetermined size and an amount of data which can be carried by frames in data-carrying radio signals, via which data is transmitted by a radio interface which is formed from a pair including a transmitter 18 and a receiver 22.

The transport data block 14 is supplied to a radio access processor 16, which controls the sequence of transmission of the transport data block 14 via the radio access interface. The transport data block 14 is supplied at an appropriate time by the radio access processor 16 to a transmitter 18, which converts the transport data block to the frame of data-carrying radio signals, which are transmitted in a time interval which is allocated to that transmitter in order to transmit the radio signals. In the receiver 22, a receiver antenna 6" identifies the radio signals and carries out downward conversion and reproduction of the data frame, and this is supplied to a radio access sequence control reversing apparatus 24. The radio access sequence control reversing apparatus 24 supplies the received data transport block to a frame conversion reversing apparatus 26 which is controlled by the multiple access sequence control reversing apparatus 24, and is supplied via a conductor 28. The rate conversion reversing apparatus 26 then supplies a representation of the reproduced data frame 8 to a destination or sink for the data frame 8 which is represented by the block 30.

The rate converter 12 and the rate conversion reversing apparatus 26 are designed such that, as far as possible, they utilize the data-carrying capacity available in the transport data block 14 optimally. According to an exemplary embodiment of the present invention, this is done via the rate matching converter 12, which is used to code the data frame and then puncture or repeat data bits or symbols which are selected from the coded data frame, with the effect of producing a transport data block which fits into the data blocks 14. The rate converter 12 has a coder and a puncturer. The data frame 8 which is supplied to the coder is coded, in order to produce a coded data frame which is supplied to the puncturer. The coded data frame is then punctured by the puncturer, in order to produce the transport data block 14. Depending on the embodiment variant, puncturing of frames can be used both in the uplink direction and in the downlink direction.

GB 2296165 A discloses a multiplex communications system, which has puncturing and interleaving.

Those skilled in the art are familiar with the fact that one effect of puncturing a coded data frame is that the probability of correct reproduction of the original data is reduced. Furthermore, the performance of known error control codes and the known decoders of these error control codes is best when the errors which occur during the transmission of the data are caused by Gaussian noise, since this has the effect that the errors are distributed independently throughout the transport data block. When a coded data frame is intended to be punctured, the positions in the coded data frame at which bits are punctured should be separated as far as possible from one another. To this extent, the puncturing positions should be distributed uniformly throughout the data frames. Since errors during transmission frequently occur in bursts, particularly in the case of radio communications systems which do not use interleaving, and since the repetitions of bits are not intended to particularly improve the quality just in a certain region of the data frame but should be as uniform as possible, positions in a coded or uncoded data frame in which data bits are intended to be repeated should be arranged similarly so that they are uniformly separated from one another throughout the entire data frame.

Known methods for selecting positions of bits or symbols which are intended to be punctured in a coded data frame include the division of the number of bits or symbols in a frame by the number of bits or symbols which are intended to be punctured, and the selection of positions with integer values corresponding to the division. In a situation in which the number of bits to be punctured is not an integer division of the number of bits in the data frame, this does not, however, lead to uniform spacings between the punctured positions, thus resulting in the disadvantage that the distance between certain punctured positions is less than this corresponding integer and, in some cases, the punctured positions are even located alongside one another.

In order to describe the complex present invention, the narrower technical field of the present invention and the problems that occur in this case will be briefly explained in the following text with reference to FIGS. 1 to 6 and 9 but, at least partially, also result from the state of standardization for the 3rd mobile radio generation (UMTS (Universal Mobile Telecommunications System)) prior to the present invention, which is specified in particular in the following document: S1.12 v0.0.1, 3GPP FDD, Multiplexing, channel coding and interleaving description.

The interleaving within a transport multiplexing method is frequently carried out in two steps. The various solutions for carrying out the puncturing/repetition have various consequences if the puncturing is carried out after the first interleaver, as is envisaged from the UMTS system. A second interleaver is now also used in the UMTS system, and is arranged after the physical channel segmentation and before the physical channel mapping (see FIG. 1). Although this interleaver results in an improvement in the transmitted bits being distributed as uniformly as possible, it has no influence, however, on the distribution of the punctured/repeated bits, and therefore will not be discussed any further for the purposes of the present invention.

FIG. 1 shows the use of an FS-MIL (FS-Multistage Interleaver) as an interleaver in the uplink path multiplexing method in conjunction with a known rate matching algorithm proposed for UMTS.

As an example, let us consider a situation in which layer 2 results in a transport block with 160 bits on a transport channel with a transmission interval of 80 ms. This bit sequence also can be described as a data frame, or as a sequence of data frames. As such, after the first interleaver, (first interleaving), the data is interleaved over eight radio frames (often also referred to as "frames" or "columns" in the following text) (see FIG. 2). In this case, the interleaving includes the bits being read line-by-line, and the bits being read column-by-column with subsequent column randomizing (columns being interchanged).

A first aim of a good puncturing algorithm is to distribute punctured bits as uniformly as possible over the bit positions in their original sequence. This was also the critical principle which was used for the definition of the puncturing algorithm for UMTS, as is described, for example, in the abovementioned Specification S1.12. This is best done by puncturing every n-th bit or, in some cases, every (n+first) bit if the puncturing rates are not integral.

A second aim is to puncture the various frames (in the following text, frames are also often referred to as columns or radio frames) with equal frequency, and hence also to distribute the punctured bits uniformly over all the frames, and also to achieve uniform puncturing in the various frames. The expressions puncturing or repetition of a column (for the frame) also refer to the puncturing or repetition of an element, in particular of a bit in the column (the frame).

Let us now assume that four bits are intended to be punctured in each frame (radio frame) in order to produce a balance for the requirements for the quality of the service of this transport channel together with other channels. The result of the rate matching algorithm—previously intended for the UMTS system—is to puncture the bits 4, 9, 14 and 19 (index starts at 0, counting based on the sequence of the bits after the first interleaving) in each frame (radio frame). In FIG. 2, a punctured bit is illustrated in bold text. In consequence, eight adjacent bits are punctured, and this, as explained above, is undesirable. The first aim mentioned above is not achieved to a satisfactory extent.

One procedure to avoid this problem would be to shift the puncturing pattern in each frame. Let us assume that $N_i$ is the number of bits in a frame before rate matching, $N_c$ is the number of bits after rate matching, $m_1$ is the index of the punctured/repeated bit, k is the frame number and K is the number of interleaved frames.

Let us then consider the situation where $N_i > N_c$, that is to say puncturing. In the above example, $N_i=20$, $N_c=16$, $m_1=4$, $m_2=9$, $m_3=14$, $m_4=19$, k=1 . . . 7 and K=8. A shift in the positions of the bits to be punctured in order to avoid the abovementioned problem can then be described by the following formula:

$m_{jshift} = (m_j + k*\lceil N_c(N_c-N_c)/K \rceil) \bmod N_i$, where $\lceil \ \rceil$ refers to round up.

The positions of the bits to be punctured resulting from this formula are illustrated, for the above example, in FIG. 3.

As can be seen from FIG. 3, the puncturing of adjacent bits is admittedly avoided to a certain extent, but this results in a cyclic effect or edge effect, that is to say for example, bits 43 and 44 are punctured, which, as explained above, is undesirable. The first aim mentioned above is accordingly once again not achieved to a satisfactory extent.

If the puncturing ratio is low, the probability of puncturing adjacent bits decreases. FIG. 4 shows an example with 10% puncturing. As can be seen from FIG. 4, some adjacent bits (bit 91 and bit 92) are still punctured, however, which results in a reduction in performance. Once again, the first aim mentioned above is not achieved to a satisfactory extent.

As an alternative to a described rate matching algorithm, it is proposed that the first interleaver (first interleaving) be optimized such that the puncturing no longer requires the described rate matching algorithm. An optimized first interleaver should reorder the bits such that adjacent bits are separated. The puncturing, accordingly can be carried out simply by removing successive bits after the interleaving process. The following options will be explained in more detail with reference to the scenario illustrated in FIG. 5.

The four blocks on TrCH A are interleaved together, and the rate matching is then carried out. When puncturing is carried out, successive bits are removed in each frame. It is therefore highly improbable that punctured bits would be adjacent in a frame, with respect to their position before the interleaving process, that is to say after coding. However, there is no guarantee that punctured bits would not be adjacent in different frames after the coding process. In consequence, a reduction in performance could occur when using this approach.

The method explained in the following text with reference to FIG. 6 could be used to solve the problem explained with reference to FIG. 4, in which method the puncturing pattern applied to a frame is also applied, after shifting, to other frames, with the shifted patterns being applied to frames before the interleaving process. FIG. 6 shows a puncturing pattern for the bit sequence example which already has been explained with reference to FIG. 3. The illustration shows that no puncturing of adjacent bits occurs, at least in this example. The reduction in performance resulting from puncturing therefore should be avoided in this case.

In fact, there is no need to carry out the above rate matching before the column randomization (column interchanging). Rate matching equivalent to this can be carried out after the column randomization by taking account of the column randomization rules, and this can be achieved just by replacing the initial column-specific offset value $e_{offset}$, which describes this shift in the application of the puncturing pattern by a simple formula. The offset value is not calculated on the basis of the column number after column randomization, but the column number before the column randomization, and this can be calculated using the inverse column interchanging rule. Furthermore, $e_{offset}$ can be used not just for puncturing, but also for repetition. Repetition bits can, thus, be positioned more uniformly.

The following text once again shows, in summary form, that the previously proposed solutions, that is to say the proposed puncturing/repetition patterns, are still not always optimum in all cases.

In the introduction, it was shown with reference to FIG. 2 and by analysis by way of example of a situation in which layer 2 provides a transport block with 160 bits on a transport channel with a transmission interval of 80 ms, and subject to the precondition that four bits should be punctured in each frame, that eight adjacent bits are punctured, which is obviously undesirable. The first aim mentioned above is not achieved to a satisfactory extent.

The proposal as shown in FIGS. 3 and 4 was to shift the puncturing pattern in each frame. Once again, as shown, this led to puncturing of adjacent bits (bits 43 and 44 as well as bits 91 and 92). The first aim mentioned above is not achieved to a satisfactory extent.

The proposal as shown in FIG. 6 provides for the use of shifted puncturing patterns after the interleaving process, in which case the column-specific shifts were determined on the basis of analyses before column interchanging. In this case, this does not lead to any adjacent punctured bits in this example.

However, in a method as shown in FIG. 6, there are always still situations in which adjacent bits are punctured, depending on the puncturing rate. FIG. 9 shows, by way of example, the situation $N_i=16$, $N_c=14$, $m_1=4$, $m_2=14$, $k= 1 \ldots 7$ and $K=8$. For the sake of simplicity, FIGS. 9 and 10 show only the area before interleaving, in which, however, those bit positions which are punctured after interleaving are illustrated by marking them in bold print. As can be seen, the adjacent bits 31 and 32 and 95–96 are punctured, which is obviously undesirable. Once again, the first aim mentioned above is not achieved to a satisfactory extent.

If, in contrast, only every n-th bit were to be punctured with respect to the original sequence after the interleaver process, then the second aim cannot always be achieved adequately. Let us assume, for example, 80-ms interleaving (as in FIG. 9) and a puncturing rate of 1:6. Puncturing every sixth bit would result in only the columns 0, 2, 4, 6 being punctured, but not the columns 1, 3, 5, 7, which is, of course, undesirable and is not consistent with the second aim. In contrast, the first aim would be achieved to a satisfactory extent.

Against this background, the present invention is directed toward reducing these disadvantages of the prior art.

SUMMARY OF THE INVENTION

Accordingly, in the embodiment of the present invention, a method is provided for data rate matching, wherein the method includes the steps of: (a) distributing data to be transmitted in the form of bits via a first interleaver to a set of K frames; (b) carrying out a puncturing or repetition method for data rate matching after interleaving; and (c) varying a distance between punctured or repeated bits with regard to the sequence of the bits before the first interleaver, for puncturing or repeating the same number of bits in each frame, with the separation being defined by the following relationship: $q-1 \leq \text{distance} \leq q+1\text{cd}(q,K)+1$, where $q:=(\lfloor N_c/(|N_i-N_c|)\rfloor) \mod K$, where $\lfloor \ \rfloor$ refers to rounding down and $|\ |$ refers to absolute value, and where $N_i:=$the number of bits after rate matching, $N_c:=$the number of bits before rate matching; and $1\text{cd}(q, K):=$highest common denominator of q and K.

In an embodiment, the following relationship is also valid when the puncturing rate or the repetition rate is equal to 1/K: $q-1 \leq \text{distance} \leq q+1\text{cd}(q,K)+1$, where: $q:=(\lfloor N_c/(|N_i-N_c|)\rfloor) \mod K$, where $\lfloor \ \rfloor$ refers to rounding down and $|\ |$ refers to absolute value, and where $N_i:=$the number of bits after rate matching, $N_c:=$the number of bits before rate matching; and $1\text{cd}(q, K):=$highest common denominator of q and K.

In an embodiment, punctured or repeated bits which are adjacent to the sequence of bits before the first interleaver are obtained by a method which includes the steps of: puncturing or repetition with a distance with regard to the sequence of the bits before the first interleaver between adjacent punctured or repeated bits of magnitude q; varying the distance to q−1 or q+1 between adjacent punctured or repeated bits, if the number of punctured or repeated bits in a frame would exceed the number of punctured or repeated bits in another frame by more than one, and if the puncturing or repetition were carried out with a distance with regard to the sequence of the bits before the first interleaver between adjacent punctured or repeated bits of magnitude q; and continuing with the step of puncturing if any further bits need to be punctured or repeated.

In an embodiment, a puncturing or repetition process is carried out in such a manner that the puncturing or repetition pattern used within a frame is also shifted and used within further frames in the set of frames.

In an embodiment, the shift $V(k)=S(k)+T(k)*Q$ in the use of the puncturing or repetition pattern to the frame k can be produced via the steps of: calculating a mean puncturing distance q=, in which case: $q:=(\lfloor N_c/(|N_i-N_c|)\rfloor)$ mod K, where $\lfloor\ \rfloor$ referes to rounding down and $|\ |$ refers to absolute value, and in which case: $N_i$:=the number of bits after rate matching, and $N_c$:=the number of bits before rate matching; calculating Q, in which case: $Q:=((\lfloor N_c/(|N_i-N_c|)\rfloor)$ div K; if q is even, then q is set to q−1cd(q, K)/K where 1cd(q, K):=the highest common denominator of q and K;—a variable i is set to zero; and repeating the following steps as long as i≦K−1: $S(R_K(\lceil i*q\rceil \mod K))=\lceil i*q\rceil$ div K), where $\lceil\ \rceil$ referes to rounding; $T((R_K(\lceil i*q\rceil \mod K))=i$, where $R_K(k)$ reverses the interleaver; and i becomes i+1.

In an embodiment, the shift $V(k)=S(k)$ of the use of the puncturing and repetition pattern to the frame k can be produced via the steps of: calculating a mean puncturing distance q, in which case: $q:=(\lfloor N_c/(|N_i-N_c|)\rfloor)$, where $\lfloor\ \rfloor$ refers to rounding down and $|\ |$ refers to absolute value, and in which case: $N_i$:=the number of bits after rate matching, $N_c$:=the number of bits before rate matching; and if q is even, then q is set to q−1cd(q, K)/K, where 1cd(q, K):=the highest common denominator of q and K;—a variable i is set to zero; and repeating the following steps as long as i≦K−1: $S(R_K(\lceil i*q\rceil \mod K))=\lceil i*q\rceil$ div K), where $\lceil\ \rceil$ refers to rounding up; $R_K(k)$, where $R_K(k)$ reverses the interleaver; i becomes i+1.

In an embodiment, bits which are to be punctured or to be repeated or produced via a method which includes the steps of: determining the integer component q of the mean puncturing distance using $q:=(\lfloor N_c/(|N_i-N_c|)\rfloor)$, where $\lfloor\ \rfloor$ refers to rounding down and $|\ |$ refers to value, and in which case: $N_i$:=the number of bits after rate matching, and $N_c$:=the number of bits before rate matching; selecting a bit to be punctured or to be repeated in a first column; selecting the next bit to be punctured or to be repeated in the next frame, starting from the last bit to be punctured or to be repeated in the previous frame by selecting the next bit at the distance q, with respect to the original sequence, starting with this last bit to be punctured or to be repeated, providing this does not lead to a frame being punctured or repeated twice, or else by selecting a bit with a distance which has been changed from q to q−1 or q+1 for puncturing or repetition; and repeating the step of selecting the next bit until all columns have been punctured or repeated once.

In an embodiment, bits in a first frame are punctured or repeated in accordance with a predetermined puncturing pattern or repetition pattern, and in order to select further bits to be punctured or to be repeated, the puncturing pattern or repetition pattern shifted and is applied to further frames, with the shift in the application of the puncturing pattern or repetition pattern to a further frame corresponding to the shift of the bit, chosen in the step of selecting the next bit in the further frame with respect to the bit chosen in the step of selecting a bit.

In a further embodiment of the present invention, a data rate matching apparatus is provided which includes: means for distributing data to be transmitted in the form of bits via a first interleaver to a set of K frames; means for carrying out a puncturing or repetition method for data rate matching after interleaving; and means for varying a distance between punctured or repeated bits with regard to the sequence of the bits before the first interleaver, for puncturing or repeating the same number of bits in each frame, with the separation being defined by the following relationship: q−1≦distance≦q+1cd(q,K)+1, where $q:=(\lfloor N_c/(|N_i-N_c|)\rfloor)$ mod K, where $\lfloor\ \rfloor$ refers to rounding down and $|\ |$ refers to absolute value, and where $N_i$:=the number of bits after rate matching, $N_c$:=the number of bits before rate matching; and 1cd(q, K):=highest common denominator of q and K.

Additional features and advantages of the present invention are described in, and will be apparent from, the following Detailed Description of the Invention and the Figures.

BRIEF DESCRIPTION OF THE FIGURES

FIG. 3 shows interleaving and shifted puncturing patterns for puncturing of four bits per frame (prior art);

FIG. 4 shows interleaving and shifted puncturing patterns for puncturing with a puncturing ratio of 10% (prior art);

FIG. 6 shows interleaving and shifted puncturing patterns for puncturing of four bits per frame (prior art);

FIG. 9 shows puncturing patterns for shifted puncturing patterns for puncturing of two bits per frame (prior art);

FIG. 10 shows a simplified illustration of the principle of puncturing which is optimized in accordance with an exemplary embodiment the present invention;

FIG. 11 shows a reference table;

FIG. 12 shows puncturing patterns for puncturing with a puncturing ratio of 20%;

FIG. 13 shows puncturing patterns for puncturing with a puncturing ratio of 1:8;

FIG. 14 shows puncturing patterns for puncturing with an odd number of bits to be punctured per frame; and FIG. 15 shows puncturing patterns under an alternate exemplary embodiment.

DETAILED DESCRIPTION OF THE INVENTION

Figure 1:
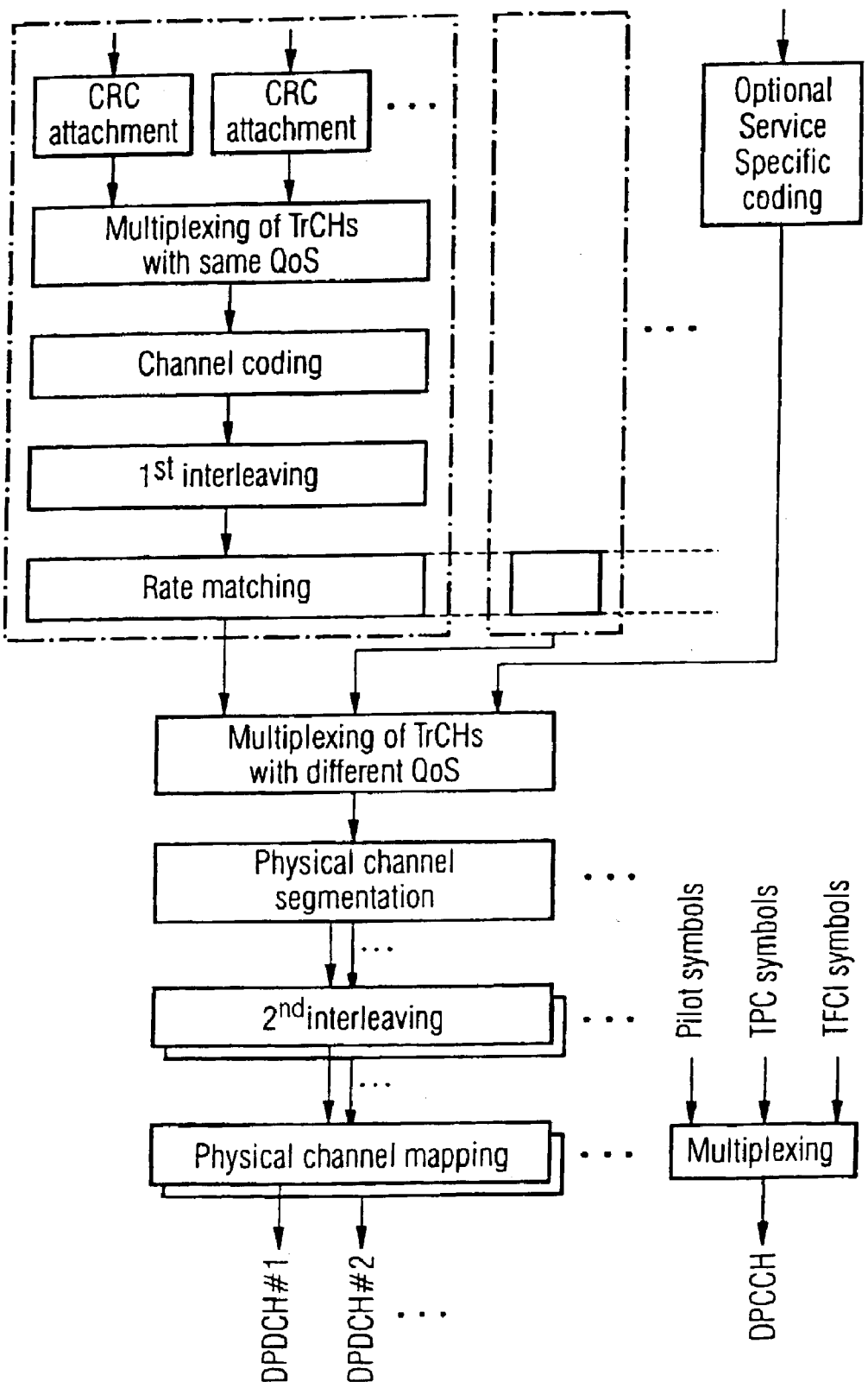
FIG. 1 shows a simplified flowchart with an interleaver before rate matching (prior art)
Figure 2:
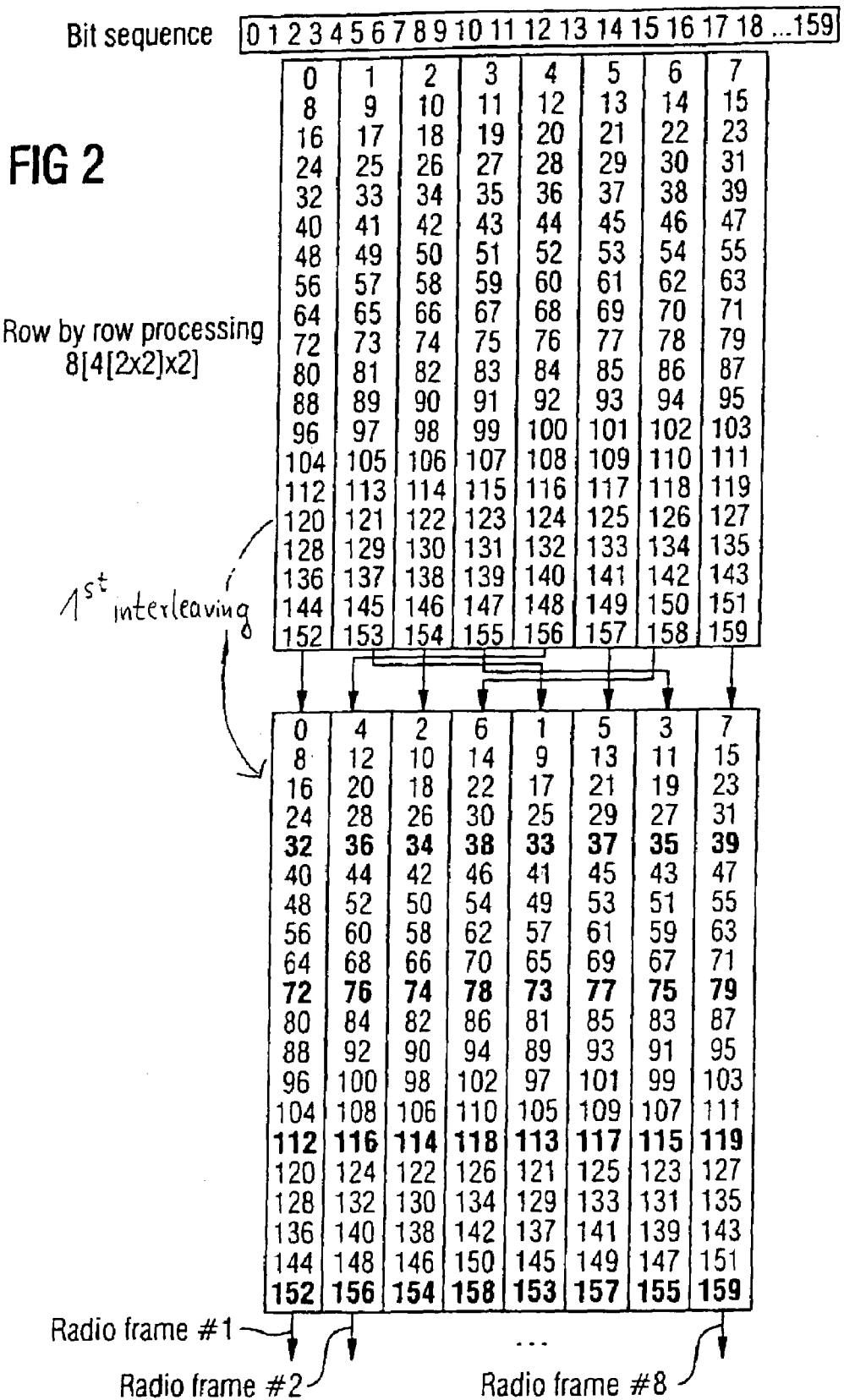
FIG. 2 shows interleaving and puncturing patterns for puncturing of four bits per frame (prior art)
Figure 5:
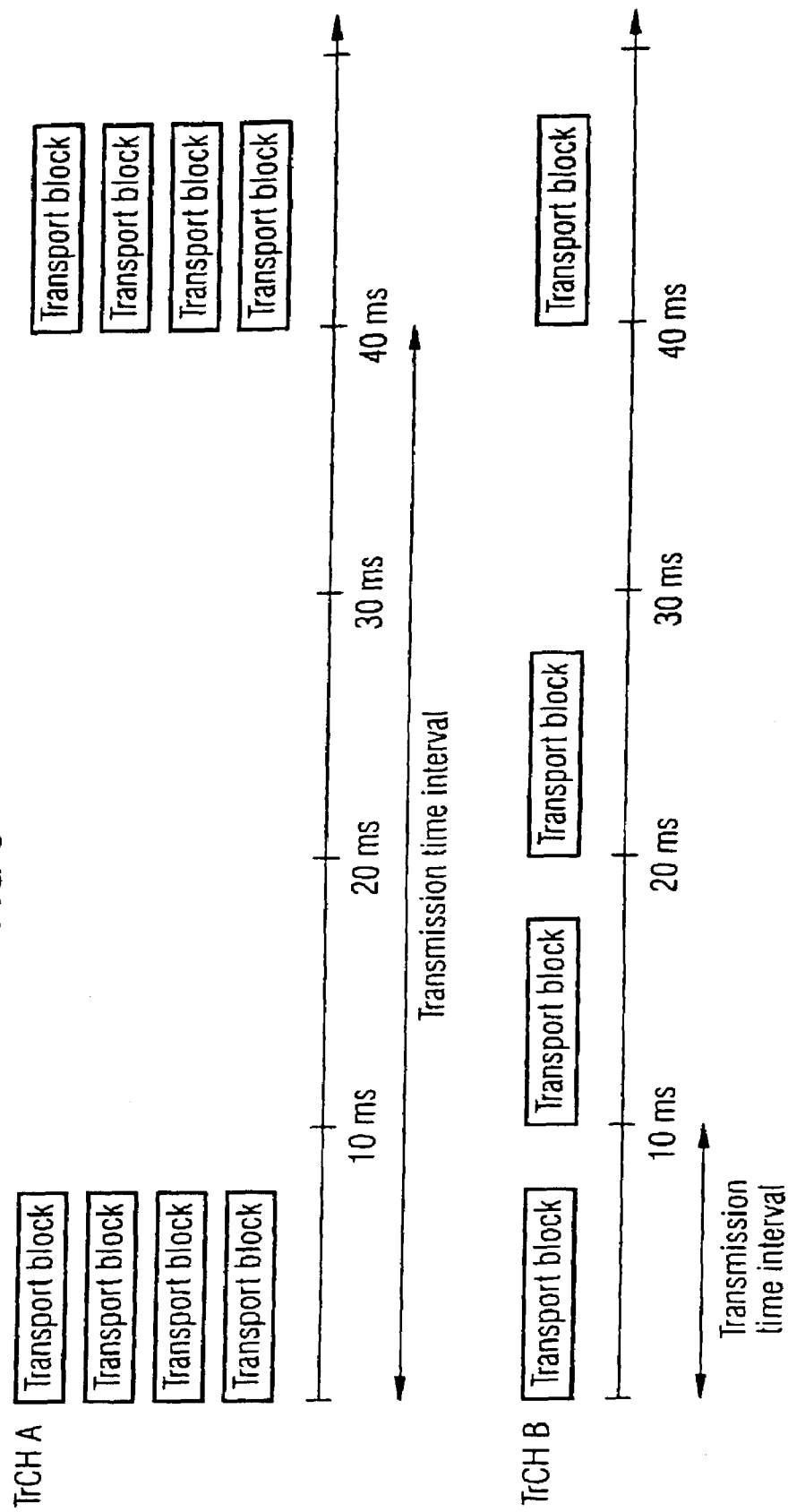
FIG. 5 shows a simplified illustration of transport channels (prior art)
Figure 7:
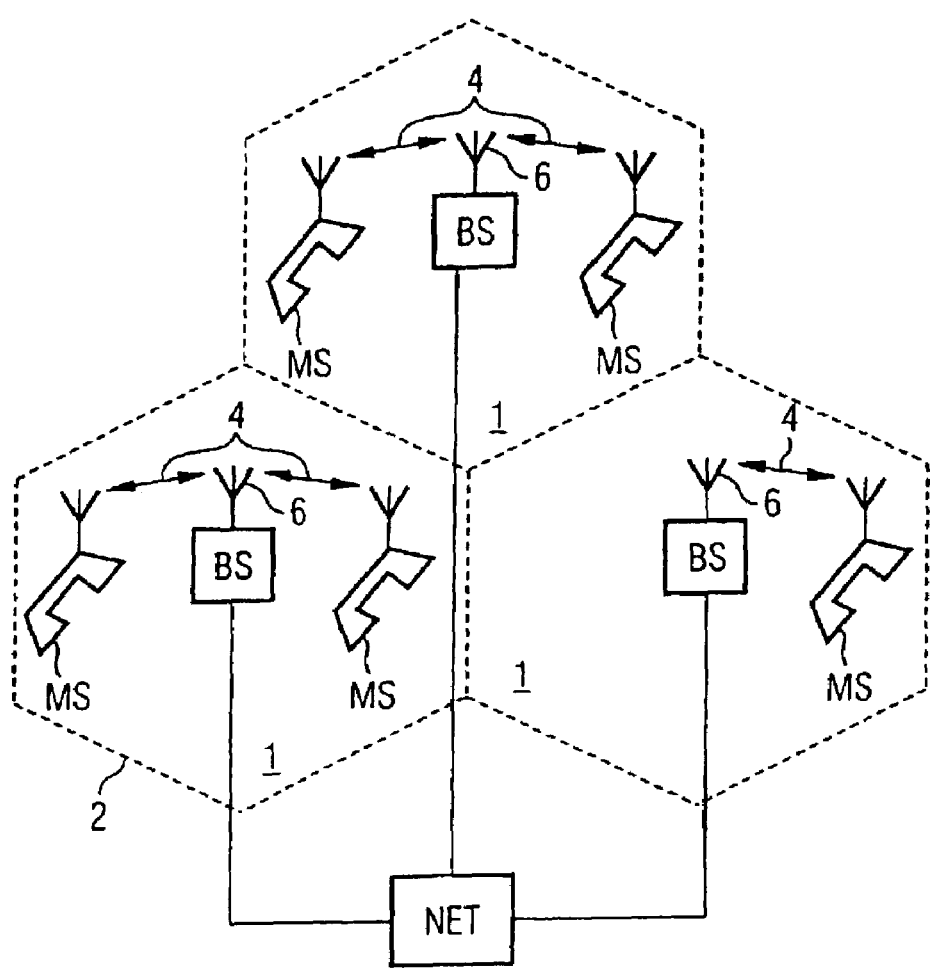
FIG. 7 shows a block diagram of a mobile radio communications system (prior art)
Figure 8:
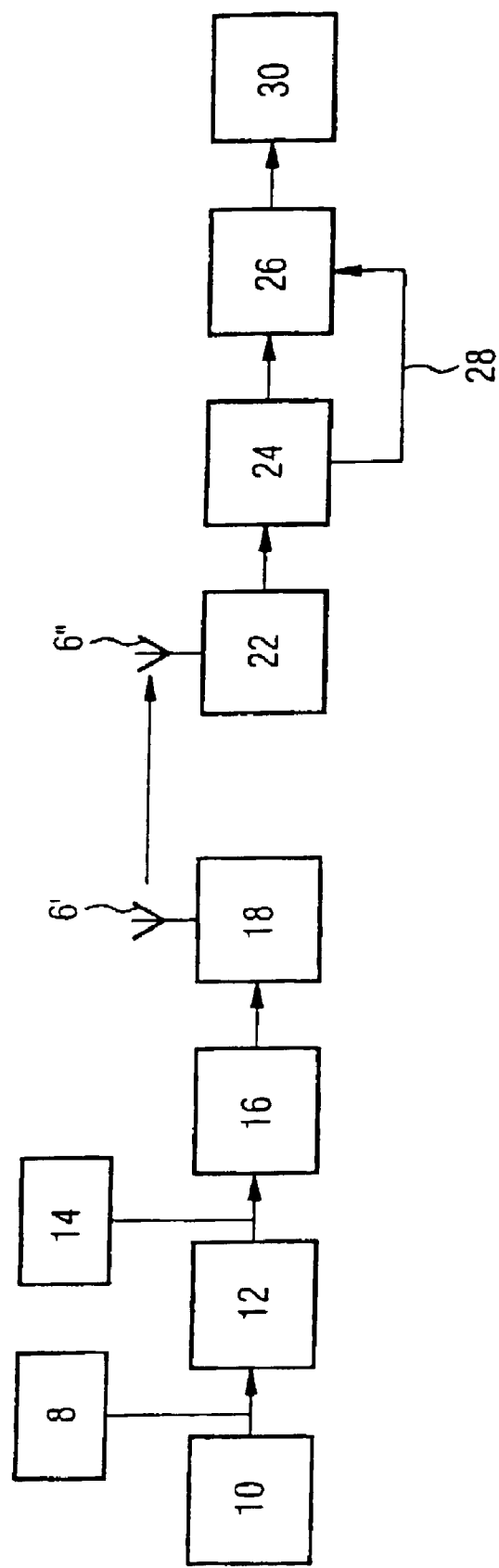
FIG. 8 shows a block diagram of a data communications arrangement, which forms a path between the mobile station and a base station in the communications network shown in FIG. 7 (prior art)

As explained above, the second aim cannot always be achieved adequately if every n-th bit were simply to be punctured after interleaving with respect to the original sequence before interleaving. However, the first aim would be achieved to an adequate extent.

In order to achieve both the abovementioned aims to a satisfactory extent, one embodiment of the present invention now provides, in contrast to the uniform puncturing with respect to the original sequence before interleaving, that the puncturing interval be varied at least once, and if necessary a number of times, in order to avoid some columns being preferred for puncturing, while others, on the other hand, are not punctured at all. This is shown in FIG. 10. Horizontal arrows (P6) with thin surrounding lines show a puncturing distance of 6, and the horizontal arrow (P5) with thick surrounding lines shows a puncturing distance of 5 in order to avoid puncturing the first column twice. Once each column has been punctured once, the pattern (as shown by the vertical arrows) can be shifted six lines downward in order to define the next bits to be punctured. This obviously corresponds to puncturing of every sixth bit in each column, that is to say it corresponds to the use of a standard rate matching algorithm and to the shifting of puncturing patterns with respect to one another in different columns.

This method will now be described using formulae in the following text.

Let us assume that $N_i$ is the number of bits in a frame before rate matching, $N_c$ is the number of bits after rate matching, $m_j$ is the index of the punctured/repeated bits, k the column or frame number after interleaving and K the number of interleaved columns or frames. The aim is to consider mainly the situation $N_i > N_c$, that is to say puncturing, but the formulae are also applicable to repetition.

In the above example, $N_i$=20, $N_c$=16, $m_1$=4, $m_2$=9, $m_3$=14, $m_4$=19, k=1 . . . 7, with k denoting the column or frame number after interleaving, and K=8. A comment is indicated by a prefix "—". The shifts V(k)=S(k)+T(k)*Q in the application of the puncturing or repetition pattern to the frame k can then be determined using the following method:

Calculation of the mean puncturing distance
q:=($\lfloor N_c/(|N_i-N_c|) \rfloor$) mod K—where $\lfloor\ \rfloor$ refers to rounding down and | | refers to absolute value.
Q:=($\lfloor N_c/(|N_i-N_c|) \rfloor$) div K
if q even—deal with as a special case:
then q=q−1cd(q, K)/K—where 1cd(q, K) refers to the highest common denominator of q and K
It should be remembered that 1cd easily can be calculated by bit manipulation, since K is a power of 2.
For the same reason, calculations with q easily can be carried out using binary fixed-point arithmetic (or integer arithmetic and a small number of shift operations).
endif
Calculation of S and T; S represents the shift in the line mod K, and T represents the shift magnitude div K;
S thus represents the shift in the line with respect to q (that is to say mod K) and T the magnitude of the shift with respect to Q (that is to say div K);
for i=0 to K−1
S($R_K(\lceil i*q \rceil$ mod K))=($\lceil i*q \rceil$ div K)—where $\lceil\ \rceil$ referes to rounding up.
T(($R_K(\lceil i*q \rceil$ mod K))=i—$R_K$(k) reverses the interleaver,
end for In an actual implementation, these formulae can be implemented as shown in FIG. 11, as a reference table. The table also includes the already described effect of the remapping of the column randomization achieved by $R_K$(k). S also can be calculated from T, as a further implementation option.

$e_{offset}$ can then be calculated as follows:

$e_{offset}(k)=((2*S)+2*TQ+1)*y+1) \bmod 2Nc$

Using $e_{offset}$ (k), e is then preloaded in the rate matching method for UMTS. This choice of $e_{offset}$ obviously results in a shift in the puncturing patterns in the columns relative to one another by the amount S+T*Q.

The following text describes a simplified representation which simply results from the calculation of q and Q not being carried out separately for the remainder in the division by K and the multiple of K, but being combined for both components. In the same way, S and T cannot be calculated separately for q and Q, but likewise combined. The substitutions q+K*Q→q and S+Q*T→S result in the following equivalent representation of the method specified above, with the shift at V(k) in this case being given by: V(k)=S(k). Depending on the details of the implementation, it may be better to carry out one calculation method or the other calculation method or further methods which are likewise equivalent to them.

Calculation of the mean puncturing distance
q:=($\lfloor N_c/(|N_i-N_c|) \rfloor$)—where $\lfloor\ \rfloor$ refers to rounding down and | | refers to absolute value.
if q even—deal with as a special case:
then q=q−1cd(q, K)/K—where 1cd(q, K) refers to the highest common denominator of q and K
It should be noted that 1cd easily can be calculated by bit manipulation, since K is a power of 2.
For the same reason, calculations with q easily can be carried out using binary fixed-point arithmetic (or integer arithmetic and a small number of shift operations).
endif
Calculation of S(k) for the shift in the column k;
for i=0 to K−1
S($R_K(\lceil i*q \rceil$ mod K))=($\lceil i*q \rceil$ div K)—where $\lceil\ \rceil$ refers to rounding up.
$R_K$(k) reverses the interleaver
end for
$e_{offset}$ can then be calculated as follows:

$e_{offset}(k)=((2*S)*y+1) \bmod 2Nc$

Using $e_{offset}$ (k), e is then initialized in advance in the rate matching method.

If the puncturing rate is an odd-numbered fraction, that is to say 1:5 or 1:9, this method likewise produces a puncturing pattern which is optimum with regard to the two aims mentioned above and which would be used directly before the interleaving by the puncturing using the rate matching method. In other situations, adjacent bits are never punctured, but the distance between adjacent punctured bits may be greater than the others by up to 1cd(q,K)+1. This method also can be applied in a corresponding manner to bit repetitions. Although the repetition of adjacent bits does not have such a severe influence on the performance of the error correction codes as is the case when puncturing adjacent bits, it is nevertheless advantageous to distribute repeated bits as uniformly as possible.

The fundamental objective of this method is to achieve a uniform distance between the punctured bits in the original sequence, but taking account of the constraint that the same number of bits must be punctured in the various frames. This is achieved by reducing the puncturing distance by 1 in certain cases. The described method is optimum to the extent that the distance is never reduced by more than 1, and it is reduced only as often as is necessary. This results in the best-possible puncturing pattern subject to the constraints mentioned above.

The following example uses FIG. 12 to show puncturing with a puncturing ratio of 1:5. The optimized algorithm obviously not only avoids the puncturing of adjacent bits, but punctured bits are also distributed with the same spacing in the original sequence. In fact, the same characteristics are achieved as if the puncturing were to be carried out directly after the coding and before the interleaving. In the specific case of 1:5 puncturing and, to put this in more general terms, whenever the puncturing rate can be written as a fraction 1:q, where q is an integer and q and K, the number of frames, do not have a common denominator, it can be said that an optimum puncturing pattern is produced despite the use of a puncturing after the first interleaver. This puncturing pattern results in the puncturing of every qth bit, in the same way as an optimum puncturing pattern which had been carried out immediately after the coding and before the interleaving.

Puncturing with a puncturing ratio of 1:8 will now be analyzed with reference to FIG. 13. Once again, the puncturing of adjacent bits is avoided. In this case, it is impossible to achieve uniformly spaced puncturing, since all the bits in an individual frame would then be punctured, which is completely unacceptable with respect to the second aim. In this case, most of the distances between adjacent bits are 7 (only one less than with an optimum distribution). In this case, some distances are greater (every eighth).

If the number $N_i$ of input bits can be divided by K, the rate matching may vary during the transmission time interval. The last frames then have one bit less than the first and, therefore, also have a somewhat lower puncturing rate. For this situation, one embodiment of the present invention provides for the puncturing patterns in the last lines not to be changed. Instead of this, the same puncturing algorithm is used as for the first columns, but without carrying out the last puncturing operation. It can be seen from FIG. 14 as an example that 125 input bits are intended to be punctured in such a manner that 104 output bits remain, which are interleaved over eight frames. The last two columns have one input bit less than the first; all the columns have 13 bits, since the last puncturing operation in the last two columns is omitted.

With regard to the aims mentioned above, the method proposed here allows optimized puncturing patterns to be specified when the rate matching is carried out after the first interleaving. The method is simple, requires little computation power and need be carried out only once per frame, and not once per bit. The method is not restricted to radio transmission systems.

Indeed, although the present invention has been described with reference to specific embodiments, those of skill in the art will recognize that changes may be made thereto without departing from the spirit and scope of the invention as set forth in the hereafter appended claims.

Under an alternate embodiment, an optimized first interleaver may be used, with a simple second interleaver and a simple puncturing method being used. Under this embodiment, an optimized interleaver can distribute bits such that the puncturing of blocks of bits after the interleaving will distribute these punctured bits uniformly before interleaving. Previously, puncturing after a simple first interleaver has shown that this is not an easy task. Since the individual interleaver could be optimized for all puncturing rates, it is very difficult to achieve good characteristics. The reason for this is exemplied in the puncturing patterns of FIG. 15, where, the patterns for n+1 bits must be identical to the puncturing pattern for n bits, although an additional bit can be chosen for puncturing. If the puncturing pattern is good for n bits (see the first line in the table in FIG. 15), then it is extremely difficult to achieve an optimum distribution of nil bits (last line) irrespective of which specific bit is additionally punctured in order to obtain n+1 bits (second line). Furthermore, such an interleaver would need to be a compromise between good puncturing characteristics for block puncturing and, at the same time, good general interleaving characteristics (for example in order to achieve good transmission characteristics for transmission via fading channels). Since, previously, no such method and no such interleaver are known, the method described in the present application is particularly advantageous, in which puncturing is carried out after a simple first interleaver with a subsequent second interleaver with optimized interleaving characteristics.

The invention claimed is:

1. A method for data rate matching, the method comprising the steps of:
   distributing data to be transmitted in the form of bits via a first interleaver to a set of K frames;
   carrying out a puncturing or repetition method for data rate matching after interleaving; and
   varying a distance between punctured or repeated bits with regard to the sequence of the bits before the first interleaver, for puncturing or repeating the same number of bits in each frame, with the separation being defined by the following relationship:
   q−1≦distance≦q+1cd(q,K)+1, where mean puncturing distance is
   $q:=(\lfloor N_c/(|N_i-N_c|)\rfloor)$ mod K, where $\lfloor\ \rfloor$ refers to rounding down and $|\ |$ refers to absolute value, and where $N_i$:=the number of bits after rate matching, $N_c$:=the number of bits before rate matching; and
   1cd(q, K):=highest common denominator of q and K,
   wherein a puncturing or repetition process is carried out in such a manner that the puncturing or repetition pattern used within a frame is also shifted and used within further frames in the set of frames, and wherein punctured or repeated bits which are adjacent to the sequence of bits before the first interleaver are obtained by a method which comprises the steps of:
   puncturing or repetition with a distance with regard to the sequence of the bits before the first interleaver between adjacent punctured or repeated bits of magnitude q;
   varying the distance to q−1 or q+1 between adjacent punctured or repeated bits, if the number of punctured or repeated bits in a frame would exceed the number of punctured or repeated bits in another frame by more than one, and if the puncturing or repetition were carried out with a distance with regard to the sequence of the bits before the first interleaver between adjacent punctured or repeated bits of magnitude q; and
   continuing with the step of puncturing if any further bits need to be punctured or repeated.

2. A method for data rate matching as claimed in claim 1, wherein
   the following relationship is also valid when the puncturing rate or the repetition rate is equal to 1/K:
   q−1≦distance≦q+1cd(q,K)+1, where mean puncturing distance is
   $q:=(\lfloor N_c/(|N_i-N_c|)\rfloor)$ mod K, where $\lfloor\ \rfloor$ refers to rounding down and $|\ |$ refers to absolute value, and where $N_i$:=the number of bits after rate matching, $N_c$:=the number of bits before rate matching; and
   1cd(q, K):=highest common denominator of q and K.

3. A method for data rate matching as claimed in claim 1, wherein the shift V(k)=S(k)+T(k)*Q in the use of the puncturing or repetition pattern to the frame k can be produced via the steps of:
   calculating a mean puncturing distance q, in which case:
   $q:=(\lfloor N_c/(|N_i-N_c|)\rfloor)$ mod K, where $\lfloor\ \rfloor$ referes to rounding down and $|\ |$ refers to absolute value, and in which case:

$N_i$:=the number of bits after rate matching, and
$N_c$:=the number of bits before rate matching;
calculating Q, in which case: Q:=($\lfloor N_c/(|N_i-N_c|) \rfloor$) div K;
if q is even, then q is set to q−1cd(q, K)/K where 1cd(q, K):=the highest common denominator of q and K;—a variable i is set to zero; and
repeating the following steps as long as i≦K−1:
  $S(R_K(\lceil i*q \rceil \bmod K))=(\lceil i*q \rceil \text{ div } K)$, where $\lceil \ \rceil$ referes to rounding;
  $T((R_K(\lceil i*q \rceil \bmod K))=i$, where $R_K(k)$ reverses the interleaver; and
  i becomes i+1.

4. A method for data rate matching as claimed in claim 1, wherein the shift V(k)=S(k) of the use of the puncturing and repetition pattern to the frame k can be produced via the steps of:
calculating a mean puncturing distance q, in which case:
  q:=($\lfloor N_c/(|N_i-N_c|) \rfloor$), where $\lfloor \ \rfloor$ refers to rounding down and | | refers to absolute value,
and in which case:
  $N_i$:=the number of bits after rate matching,
  $N_c$:=the number of bits before rate matching; and
if q is even, then q is set to q−1cd(q, K)/K, where 1cd(q, K):=the highest common denominator of q and K;—a variable i is set to zero; and
repeating the following steps as long as i≦K−1:
  $S(R_K(\lceil i*q \rceil \bmod K))=(\lceil i*q \rceil \text{ div } K)$, where $\lceil \ \rceil$ refers to rounding up;
  $R_K(k)$, where $R_K(k)$ reverses the interleaver; and
  i becomes i+1.

5. A method for data rate matching as claimed in claim 1, wherein bits which are to be punctured or to be repeated are produced via a method which comprises the steps of:
determining the integer component q of the mean puncturing distance using q:=($\lfloor N_c/(|N_i-N_c|) \rfloor$), where $\lfloor \ \rfloor$ refers to rounding down and | | refers to value, and in which case:
  $N_i$:=the number of bits after rate matching, and
  $N_c$=the number of bits before rate matching;
selecting a bit to be punctured or to be repeated in a first column;
selecting the next bit to be punctured or to be repeated in the next frame, starting from the last bit to be punctured or to be repeated in the previous frame by selecting the next bit at the distance q, with respect to the original sequence, starting with this last bit to be punctured or to be repeated, providing this does not lead to a frame being punctured or repeated twice, or else by selecting a bit with a distance which has been changed from q to q−1 or q+1 for puncturing or repetition; and
repeating the step of selecting the next bit until all columns have been punctured or repeated once.

6. A method for data rate matching as claimed in claim 5, wherein bits in a first frame are punctured or repeated in accordance with a predetermined puncturing pattern or repetition pattern, and
in order to select further bits to be punctured or to be repeated, the puncturing pattern or repetition pattern shifted and is applied to further frames, with the shift in the application of the puncturing pattern or repetition pattern to a further frame corresponding to the shift of the bit, chosen in the step of selecting the next bit in the further frame with respect to the bit chosen in the step of selecting a bit.

7. A data rate matching apparatus, comprising:
means for distributing data to be transmitted in the form of bits via a first interleaver to a set of K frames;
means for carrying out a puncturing or repetition method for data rate matching after interleaving; and
means for varying a distance between punctured or repeated bits with regard to the sequence of the bits before the first interleaver, for puncturing or repeating the same number of bits in each frame, with the separation being defined by the following relationship:
  q−1≦distance≦q+1cd(q,K)+1, where mean puncturing distance is
  q:=($\lfloor N_c/(|N_i-N_c|) \rfloor$) mod K, where $\lfloor \ \rfloor$ refers to rounding down and | | refers to absolute value, and where $N_i$=the number of bits after rate matching, $N_c$=the number of bits before rate matching; and 1cd(q, K):=highest common denominator of q and K;
wherein a puncturing or repetition pattern used within a frame in the puncturing or repetition means is also shifted and used within further frames in the set of frames, and wherein punctured or repeated bits which are adjacent to the sequence of bits before the first interleaver are obtained by a part which comprises:
  means for puncturing or repetition with a distance with regard to the sequence of the bits before the first interleaver between adjacent punctured or repeated bits of magnitude q;
  means for varying the distance to q−1 or q+1 between adjacent punctured or repeated bits, if the number of punctured or repeated bits in a frame would exceed the number of punctured or repeated bits in another frame by more than one, and if the puncturing or repetition were carried out with a distance with regard to the sequence of the bits before the first interleaver between adjacent punctured or repeated bits of magnitude q; and
  means for continuing with the step of puncturing if any further bits need to be punctured or repeated.

8. A method for data rate matching, the method comprising the steps of:
distributing data to be transmitted in the form of bits via a first interleaver to a set of K frames;
carrying out a puncturing or repetition method for data rate matching after interleaving; and
varying a distance between punctured or repeated bits with regard to the sequence of the bits before the first interleaver, for puncturing or repeating the same number of bits in each frame, with the separation being defined by the following relationship:
  q−1≦distance≦q+1cd(q,K)+1, where
  q:=($\lfloor N_c/(|N_i-N_c|) \rfloor$) mod K, where $\lfloor \ \rfloor$ refers to rounding down and | | refers to absolute value, and where $N_i$:=the number of bits after rate matching, $N_c$:=the number of bits before rate matching; and
  1cd(q, K):=highest common denominator of q and K,
wherein bits which are to be punctured or to be repeated are produced via a method which comprises the steps of:
determining the integer component q of the mean puncturing distance using q:=($\lfloor N_c/(|N_i-N_c|) \rfloor$), where $\lfloor \ \rfloor$ refers to rounding down and | | refers to value, and in which case:
  $N_i$:=the number of bits after rate matching, and
  $N_c$:=the number of bits before rate matching;
selecting a bit to be punctured or to be repeated in a first column;
selecting the next bit to be punctured or to be repeated in the next frame, starting from the last bit to be punctured or to be repeated in the previous frame by selecting the next bit at the distance q, with respect to the original sequence, starting with this last bit to be punctured or to be repeated, providing this does not lead to a frame being punctured or repeated twice, or else by selecting a bit with a distance which has been changed from q to q−1 or q+1 for puncturing or repetition; and repeating the step of selecting the next bit until all columns have been punctured or repeated once.

* * * * *